United States Patent [19]
Frankeny et al.

[11] Patent Number: 5,770,891
[45] Date of Patent: Jun. 23, 1998

[54] SOCKET FOR SEMI-PERMANENTLY CONNECTING A SOLDER BALL GRID ARRAY DEVICE USING A DENDRITE INTERPOSER

[75] Inventors: Richard Francis Frankeny, Elein; Jerome Albert Frankeny, Taylor; Danny Edward Massey, Georgetown; Keith Allan Vanderlee, Austin, all of Tex.

[73] Assignee: International Business Machines Corporation, Armonk, N.Y.

[21] Appl. No.: 718,120

[22] Filed: Sep. 18, 1996

Related U.S. Application Data

[62] Division of Ser. No. 536,880, Sep. 29, 1995, Pat. No. 5,691,041.

[51] Int. Cl.⁶ .......................... H01L 23/10; H01L 23/32; H01L 23/522
[52] U.S. Cl. .......................... 257/727; 257/733; 257/778; 257/785; 257/698; 257/780; 361/783
[58] Field of Search .................................. 257/727, 731, 257/733, 778, 785, 698, 780; 361/783; 439/64, 66–74, 91

[56] References Cited

U.S. PATENT DOCUMENTS

| | | |
|---|---|---|
| 4,381,131 | 4/1983 | Demnianiuk . |
| 4,652,973 | 3/1987 | Baker et al. . |
| 4,679,118 | 7/1987 | Johnson et al. . |
| 4,748,495 | 5/1988 | Kucharek . |
| 4,923,404 | 5/1990 | Redmond et al. . |
| 4,927,369 | 5/1990 | Grabbe et al. . |
| 4,932,883 | 6/1990 | Hsia et al. . |
| 4,933,747 | 6/1990 | Schroeder ............................ 257/727 |
| 4,933,808 | 6/1990 | Horton et al. . |
| 4,954,878 | 9/1990 | Fox et al. . |
| 5,123,850 | 6/1992 | Elder et al. . |
| 5,137,461 | 8/1992 | Bindra et al. . |
| 5,161,983 | 11/1992 | Ohno et al. . |
| 5,163,837 | 11/1992 | Rowlette, Sr. . |
| 5,171,290 | 12/1992 | Olla et al. . |
| 5,199,889 | 4/1993 | McDevitt, Jr. . |
| 5,207,585 | 5/1993 | Byrnes et al. . |
| 5,215,472 | 6/1993 | DelPrete et al. . |
| 5,221,209 | 6/1993 | D'Amico . |
| 5,232,372 | 8/1993 | Bradley et al. . |
| 5,237,743 | 8/1993 | Busacco et al. . |

(List continued on next page.)

OTHER PUBLICATIONS

IBM Technical Disclosure Bulletin, vol. 37, No. 10, Oct. 1994, "Double–Sided, Replaceable, Dendrite–Plated Interposer for Connector Applications" pp. 35–36.

(List continued on next page.)

*Primary Examiner*—Jerome Jackson
*Assistant Examiner*—John Guay
*Attorney, Agent, or Firm*—Casimer K. Salys

[57] ABSTRACT

A socket for attaching a flip chip die or ball grid array devices to a printed circuit board substrate having a pattern of solder covered lands, with resources for removing the flip chip die or ball grid array device, resources for directly aligning the solder balls of the flip chip die or ball grid array device to the printed circuit board, resources for using an interposer of dendrite coated vias or pads to electrically and physically connect the solder balls of the flip chip die or ball grid array devices to the solder deposits of the printed circuit board, resources for having the interposer reconfigure the wiring for testing or replacement purposes, resources for utilizing the flexibility and resilience of the interposer to improve dendrite connections, and resources for heat sinking the flip chip die or ball grid array device by direct thermal contact. The socket applies an evenly distributed force to connect the aligned flip chip die or ball grid array device solder ball pattern to the underlying printed circuit board solder deposit pattern through dendrite penetration of the solder using an interposer situated between and aligned to each such solder pattern.

4 Claims, 4 Drawing Sheets

U.S. PATENT DOCUMENTS

| | | |
|---|---|---|
| 5,248,262 | 9/1993 | Busacco et al. . |
| 5,258,648 | 11/1993 | Lin . |
| 5,302,853 | 4/1994 | Volz et al. . |
| 5,313,099 | 5/1994 | Tata et al. . |
| 5,363,275 | 11/1994 | Frankeny et al. . |
| 5,397,245 | 3/1995 | Roebuck et al. . |
| 5,397,919 | 3/1995 | Tata et al. . |
| 5,413,489 | 5/1995 | Switky . |
| 5,419,710 | 5/1995 | Pfaff . |
| 5,426,405 | 6/1995 | Miller et al. ............................. 333/247 |
| 5,451,165 | 9/1995 | Cearley-Cabbiness et al. . |
| 5,468,157 | 11/1995 | Roebuck et al. . |
| 5,468,158 | 11/1995 | Roebuck et al. . |
| 5,468,996 | 11/1995 | Chan et al. . |
| 5,477,161 | 12/1995 | Kardos et al. . |
| 5,493,475 | 2/1996 | Lin . |
| 5,648,893 | 7/1997 | Loo et al. ............................... 257/727 |

OTHER PUBLICATIONS

IBM Technical Disclosure Bulletin, vol. 36, No. 7, Jul. 1993, "Interposer for Direct Chip Attach or Surface Mount Array Devices", pp. 137–138.

Abstract, Proceedings of the Technical Conf. 1991 International Electronic Packaging Conference, Int. Electronic Packaging Conf., San Diego, CA, Sep. 1991, pp. 549–562.

*Advanced Packaging,* May/Jun. 1995, "Mini BGA", Chanchani et al.

*1992 Circuit Components Inc.,* "Isocon Interconnections" features and applications.

*Iicit Symposiom,* San Diego, CA, International Institute of Connector and Interconnection Technology, Oct. 1991, "Compression Mount Connectors Considerations for LGA and MCM applications", Kirkman, pp. 341–347.

*Circuit World,* vol. 21, No. 2, 1995, "A Reliability Study of Fuzz Button Interconnects", Harris et al, pp. 12–18.

*Electronic News,* vol. 41, No. 2080, Aug. 1995, "BGA Production Goals to Key Smi . . . Vendors to Tackle Problems of Producing High–Volume BGAs", Levine.

*1992 Proceedings of the IEEE Multi–Chip Module Conference,* MCMC–92, Mar. 18–20, 1992, "Fine Pitch Pad Array Carrier Sockets for MultiChip Modules", Trent et al, pp. 40–43.

SOCKET FOR SEMI-PERMANENTLY CONNECTING A SOLDER BALL GRID ARRAY DEVICE USING A DENDRITE INTERPOSER

This application is a division of U.S. patent application Ser. No. 08/536,880, filed on Sep. 29, 1995 now U.S. Pat. No. 5,691,041.

CROSS REFERENCE TO RELATED APPLICATIONS

The invention in the present application is related to the subject matter in copending U.S. patent application Ser. No. 08/352,301, filed Dec. 7, 1994. The applications are commonly assigned.

FIELD OF THE INVENTION

The present invention relates generally to the connection of the electronic devices. More particularly, the invention is directed to a socket which reliably connects a ball grid array configured electronic device to a printed circuit board substrate having a corresponding connection pattern, yet facilitates easy removal of the electronic device for replacement or the like.

BACKGROUND OF THE INVENTION

Shrinking integrated circuit dimensions and increasing functionality have dramatically increased the input/output connections of die packages while decreasing the contact pitch. These trends have led to die packaging technologies which utilize ball grid array input/output connections, in contrast to the peripherally located pin technologies characterizing conventional designs. A particularly efficient input/output connection technique for integrated circuit die is the flip chip technology, where the ball grid array is formed onto the die body. Integrated circuit die packages using arrays of pins instead of balls do exist, but they are very expensive, susceptible to damage, and require complex mating sockets.

Multi-chip module technology represents another packaging application where fine pitch ball grid array connections are finding increased use. Again, connection of the module ball grid array to the electronic system printed circuit board has proven to be a challenge if removal of the module with reasonable effort is contemplated.

Ball grid array modules or flip chip die are conventionally attached to correspondingly arranged arrays of copper lands on printed circuit boards through solder reflow techniques. Typically, low temperature solder or low temperature solder paste predeposited on the printed circuit board is reflowed to make the connections to high temperature solder balls formed on the ball grid array module or flip chip die.

The use of a ball grid array to connect modules or die to a printed circuit board materially increases the relative density of connections attainable when compared to peripheral pin or pin grid array packages. Unfortunately, ball grid array configured modules and die suffer in two respects. First, it is difficult to make reliable temporary connections to the balls of the die or modules for purposes such as testing or burn-in. Secondly, if a defective connection occurs between a solder ball of the grid and a printed circuit board land during reflow attachment it is difficult to locate and correct the defective solder connection. In most cases, the complete module or flip chip die must be desoldered.

Developers of the assignee recently discovered that palladium dendrites formed by plating metal vias or pads can be used to make reliable connections between the vias or pads and solder balls of modules or die. Connections between dendrite covered pads or via ends and solder balls were found to be particularly effective in that the dendrites penetrate the solder ball surface oxides, for reliable electrical connections, and become imbedded into the relatively softer solder sufficiently to produce a mechanical bond and seal between the dendrite covered via or pad and the solder ball. The related concepts are described in U.S. Pat. No. 5,137,461 and IBM Technical Disclosure Bulletin Volume 36, No. 7, July 1993, pages 137 and 138, the subject matter of both references being incorporated herein by reference.

Though the use of dendrites, and the connection of a solder ball grid array devices to dendrite plated vias or pads has been known, attempts to apply the concept have proven less than successful. When attempts were made to connect a ball grid array module, nominally having 0.75 millimeter balls with a spacing of 1.25 millimeters, or a flip chip die, nominally having 0.125 balls with a spacing of 0.25 millimeters, array alignment and reliable connection between the array of solder balls and an array of solder covered lands on a printed circuit board using a dendritic interposer proved to be a significant challenge.

Therefore, there arose a need for a ball grid array device socket which allowed for a temporary but reliable connection between the solder balls of a ball grid device and a corresponding pattern of lands on a circuit board while allowing removal or replacement of the module or die as needed.

SUMMARY OF THE INVENTION

The present invention relates to an electronic device socket, comprising a planar interposer of flexible dielectric material having a multiplicity of vias or pads covered with dendrites, which vias or pads are distributed in a pattern substantially conforming to an electronic ball grid array device, a rigid cap with a planar surface alignable to be substantially coplanar with the surface of the ball grid array device, means for aligning a pattern of balls on a surface of the ball grid array device with the planar interposer and with a pattern contact regions on a board, and means for translating the rigid cap to compress the ball grid array device, the interposer, and the contact regions of the board adequately to cause dendrite penetration into the ball grid array device balls and the contact regions on the board.

In a particularized form of the invention, the ball grid array socket comprises a rigid planar stiffener, with alignment pins for extending through a printed circuit board, a planar interposer having a multiplicity of dendrite coated vias or pads alignable by holes to the pins of the stiffener, an alignment planar having holes for alignment with the pins of the stiffener and with select balls of a ball grid array device, a rigid planar heatsink capable cap, and an arch connectable to the alignment pins of the stiffener. A screw in the arch applies a force to the cap to compress connect the balls of the ball grid array device to the top side of the interposer and the bottom side of the interposer to solder deposits on lands of the printed circuit board. In another form, the flexible interposer is itself composed of multiple layers with electrical routing to provide distinct signal paths, ground planes and power supply connections to individual ball grid array device ball connections.

These and other features of the invention will be more clearly understood and appreciated upon considering the preferred embodiments described hereinafter.

DESCRIPTION OF THE PREFERRED EMBODIMENT

Figure 1:
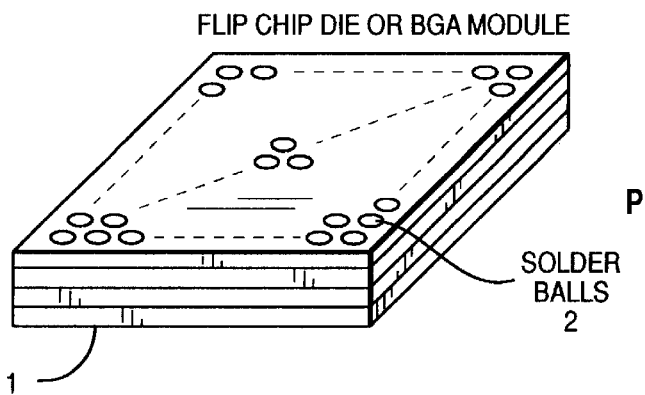
FIG. 1 depicts a flip chip die or ball grid array module with an array of solder balls.

FIG. 1 depicts a flip chip die or ball grid array electronic module 1 having a pattern of hemispherically shaped high temperature solder balls distributed in an array pattern on at least one planar surface. Heretofore the method of attaching such a chip or die to a printed circuit board, or in some cases a ceramic multilayer interconnect base, involved solder reflow. If a ceramic substrate were being used, the reflow could utilize the high temperature solder balls themselves. On the other hand, and the more prevalent practice, involves the formation of low temperature solder or solder paste on a correspondingly patterned array of printed circuit board lands. Reflow of the relatively lower temperature solder on the printed circuit board thereafter connects the flip chip die or ball grid array module solder balls to the printed circuit board lands.

Given the fine pitch and dimensions of the solder balls on the flip chip die or ball grid array modules, testing and burn-in of such electronic devices has been relatively difficult. In part, the difficulty is attributable to the rigidity of the die and module bodies and the tolerances of the hemispherical balls. Foremost, correction of reflow soldered connection defects, or die or module failures, require full desoldering. Therefore, a semi-permanent connection system is desirable.

Semi-permanent connection with the socket of the present invention provides reliable connection for purposes of testing or burn-in, yet is suitable for substantially permanent connection to printed circuit board systems. Evaluation of connections made with palladium dendrites has confirmed that the dendrites not only penetrate the solder ball oxides to create a good electrical connection but retain the connection and a related intermetal seal by the thermocompression bond between the dendrites and the solder.

The forces associated with embedding the dendrites into the solder, and breaking the bond formed thereby during disassociation, damage the dendrites with repeated cycles. Therefore, for testing purposes, the dendrite covered contacts must be replaced or otherwise rejuvenated. The same is true if multiple connections and removals are contemplated for the final application. In addition, because the dimensions of the dendrites are materially smaller than the tolerances of the solder balls on the die, modules, and circuit board lands, mating dimensions must be managed by design features other than the protrusion range of the dendrites themselves.

Figure 2:
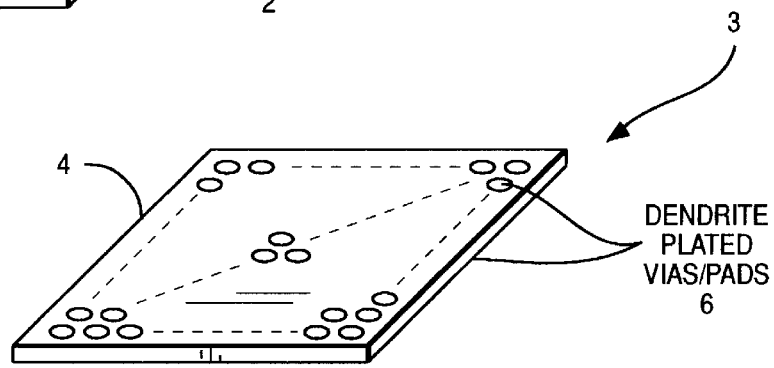
FIG. 2 depicts an interposer composed of dendrite plated vias or pads on opposite sides.
Figure 3:
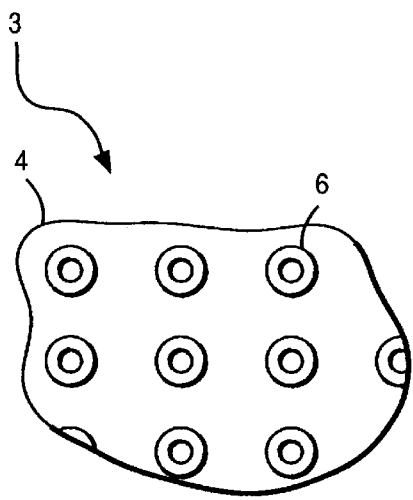
FIG. 3 depicts a part of the interposer in FIG. 2 with dendrite plated vias.
Figure 4:
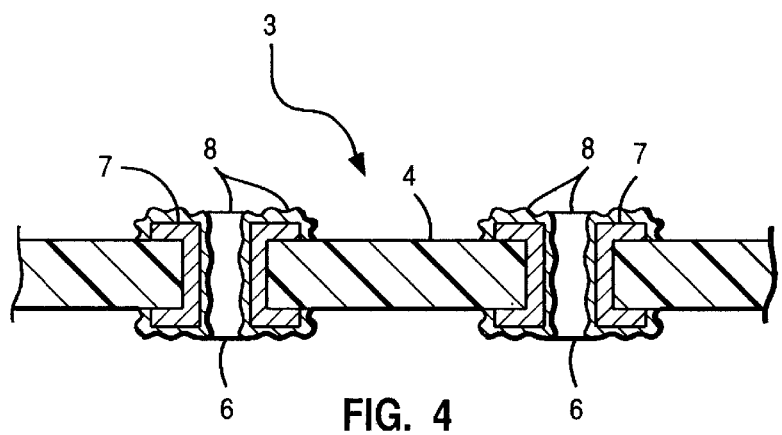
FIG. 4 schematically depicts by magnified cross section two dendrite plated vias of an interposer.

FIG. 2 depicts a key element of the socket for semi-permanently connecting a flip chip die or ball grid array module to a printed circuit board. A thin interposer 3 is fabricated to have palladium dendrites plated onto vias or pads on opposite planar surfaces in patterns respectively matching the solder balls of the flip chip die or ball grid array module on one side and the printed circuit board lands on the other side. Preferably, body 4 of interposer 3 is fabricated from a thin, nominally 0.05 to 0.5 millimeter thick, layer of flexible and resilient high dielectric polymer such as epoxy-ASM which is commercially available from IBM Corporation. In one embodiment, palladium dendrites are plated onto copper plated through hole vias 6, such as shown in FIGS. 3 and 4. FIGS. 3 and 4 show that the plated through holes 6 pass straight through dielectric body 4 of interposer 3. The plated through holes 6 are composed of plated copper layer 7 covered by a dendritic outer surface layer 8 of plated palladium. A further description of such interposer appears in the IBM Technical Disclosure Bulletin Vol. 37, No. 10, October 1994 on pages 35 and 36, authored by inventors hereof, and incorporated herein by reference.

Figure 5:
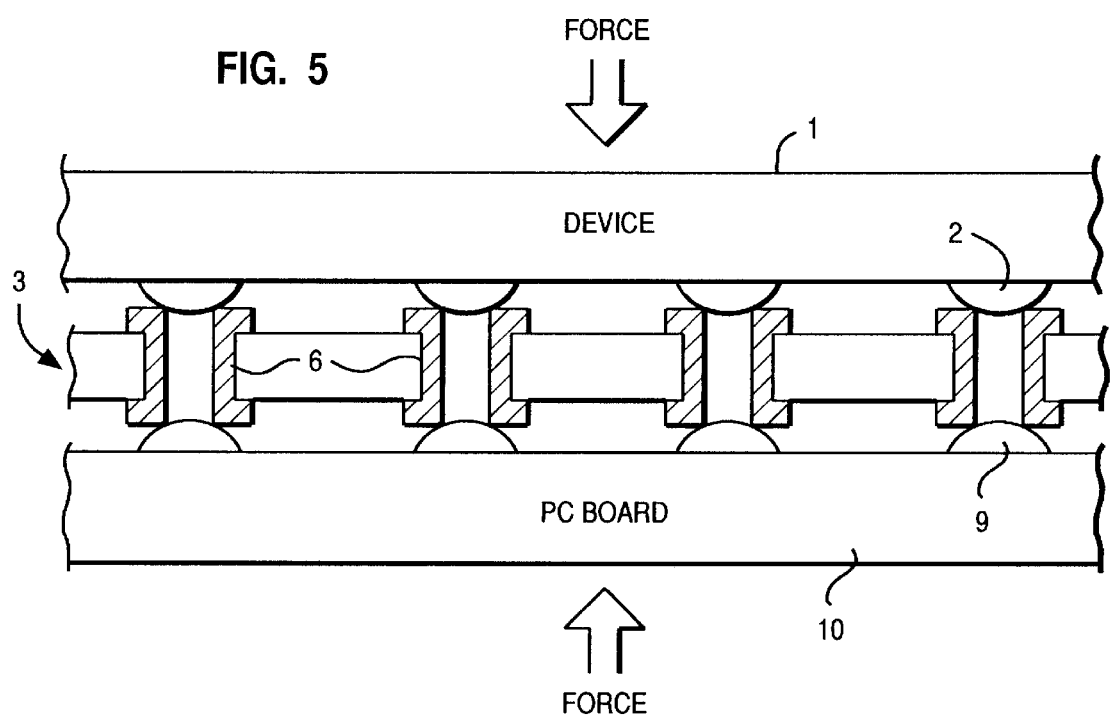
FIG. 5 schematically depicts the connection of a flip chip die or ball grid array module to a printed circuit board using an interposer with dendrite covered vias.

FIG. 5 illustrates the use of the interposer to connect a pattern of solder balls on a flip chip die or ball grid array module 1 to a like pattern of solder covered lands 9 on a printed circuit board or other substrate 10 through the use of compressive force. In this context, the dendrites on the outer surfaces of the plated through holes 6 in interposer 3 are embedded into solder balls 2 and 9 when compressed as shown in FIG. 5. The dendrites create not only the electrical connection between solder balls 2 and 9 but also a physical connection which retains the bond in the absence of further compressive force.

Figure 6:
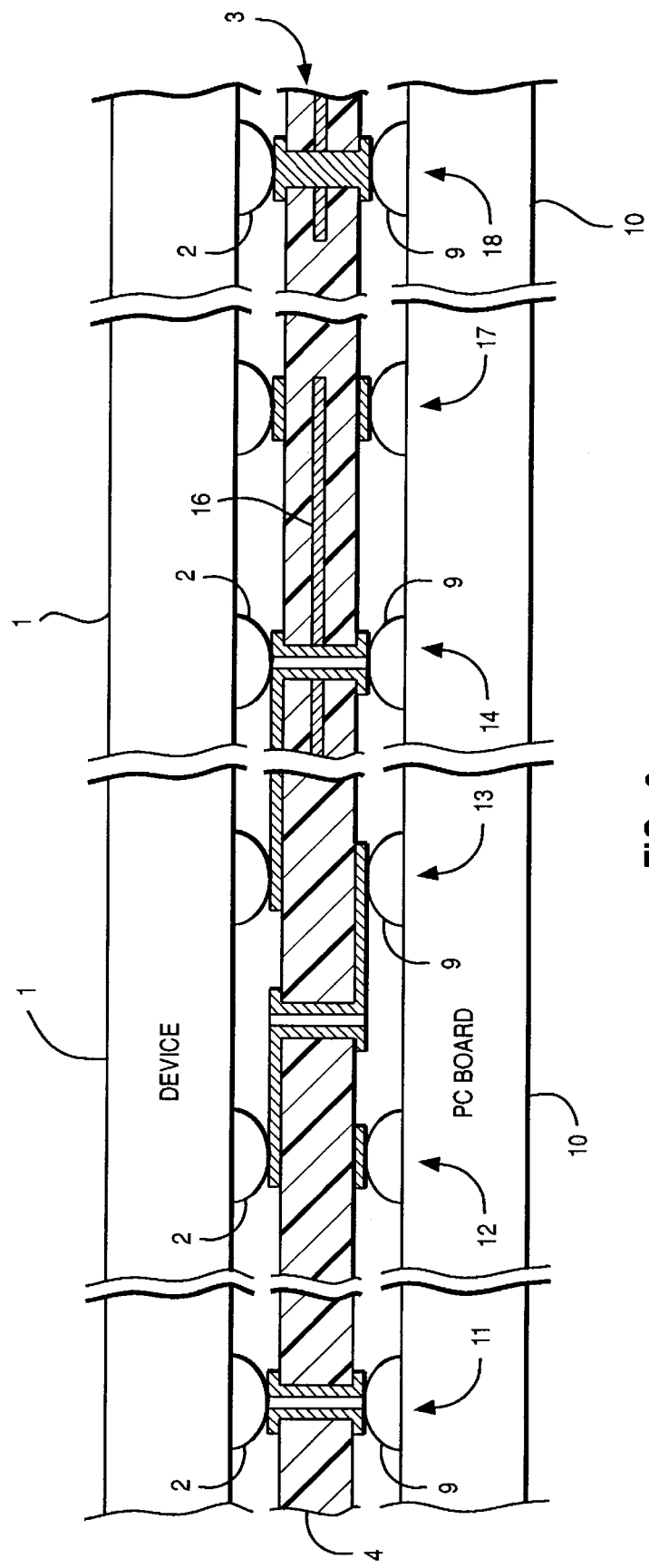
FIG. 6 schematically depicts by cross section various potential embodiments of the interposer as may be utilized with the present socket.

FIG. 6 illustrates variations of the interposer 3 and its applications. Interposer 3 is shown to include the ability to reroute the electrical wiring between electronic device 1 and printed circuit board 10 directly or through intermediate layers. Also shown is the ability to add ground or power planes, and the ability to utilize the flexibility and resilience of the interposer dielectric to offset solder ball tolerances. At location 11 in FIG. 6 a plated through hole via uses dendrites to connect a flip chip die or ball grid array module solder balls 2 to printed circuit board solder deposit 9 in the manner described earlier. However, at location 12 solder ball 2 is not connected directly to the underlying solder deposit 9, but rather, is connected to the solder deposit at location 13 of the printed circuit board. This implementation of the interposer positions the via between solder ball locations but connects to the solder balls using somewhat resilient dendrite covered pads formed on the outer surface of interposer 3. In this implementation, the flexibility and resilience of the interposer dielectric and pad layer is used to offset solder ball or solder deposit dimensional variations. It should be apparent that the interposer pad connected to solder deposit 9 at location 13 could have been configured to connect to deposit 9 at location 12, thereby resulting in a vertically aligned connection while retaining the resilience effect of the dielectric.

The electrical connections created at locations 13 and 14 illustrate further variations of the diversity characterizing interposer 3. Note that solder ball 2 at location 13 is electrically connected to solder ball 2 at location 14, and is further common to the solder deposit 9 at location 14 together with intermediate layer 16 internal to the body of interposer 3. Conductor 16 can be a ground plane, a power plane or a signal line. As preferably implemented and shown at location 17, interposer 3 includes pads on the outer surfaces at every location of solder balls 2 and solder deposits 9, even when electrical connections to such solder regions are not being made, to improve the planarity of the composite structure. Lastly, as shown at location 18, the via extending through interposer 3 may be solid as opposed to the plated through hole configuration described heretofore.

The depiction at location 20 illustrates a further variant of interposer 3 as suited for use in the socket of the present invention. In this case via 25 and any related pads regions are fabricated to be of materially smaller diameter than solder ball 2 and solder deposit 9. Investigation has confirmed that when the vias are nominally 0.25 millimeters or less in diameter they produce a local stress exceeding the yield strength of the solder. Under such conditions the dendrite covered ends of the vias are fully embedded into the solder, improving the electrical connection, further sealing the connection, and accentuating the thermocompression bond between the palladium dendrites and solder. This embodiment is preferred in that the compressive force required for each connection is lowered significantly.

The depictions of electrical interconnects characterizing interposer 3 shown in FIG. 6 illustrate a variety of somewhat different implementations. Normally, these would not exist in a single interposer, but rather would be used as the circumstances dictate. For example, if pads are used to utilize the flexibility and resilience of the interposer dielectric, the practice would apply over the whole interposer since connections align to a plated through hole via negate the benefits of the resilience and flexibility.

Though interposer 3 has been shown to incorporate a single internal wiring layer, the design is fully capable of multiple layers which serve functions analogous to a printed circuit board. With such an implementation the interposer provides wiring to interface flip chip die or ball grid array modules having different solder ball patterns to a common printed circuit board solder deposit array configuration. It also provides corrective interconnect modification for testing or manufacture. Photoimagable dielectric polymers are available for forming multilayer interposer structures. An example of such polymer is described in U.S. Pat. No. 5,300,402, the subject matter of which is incorporated herein by reference.

Figure 7:
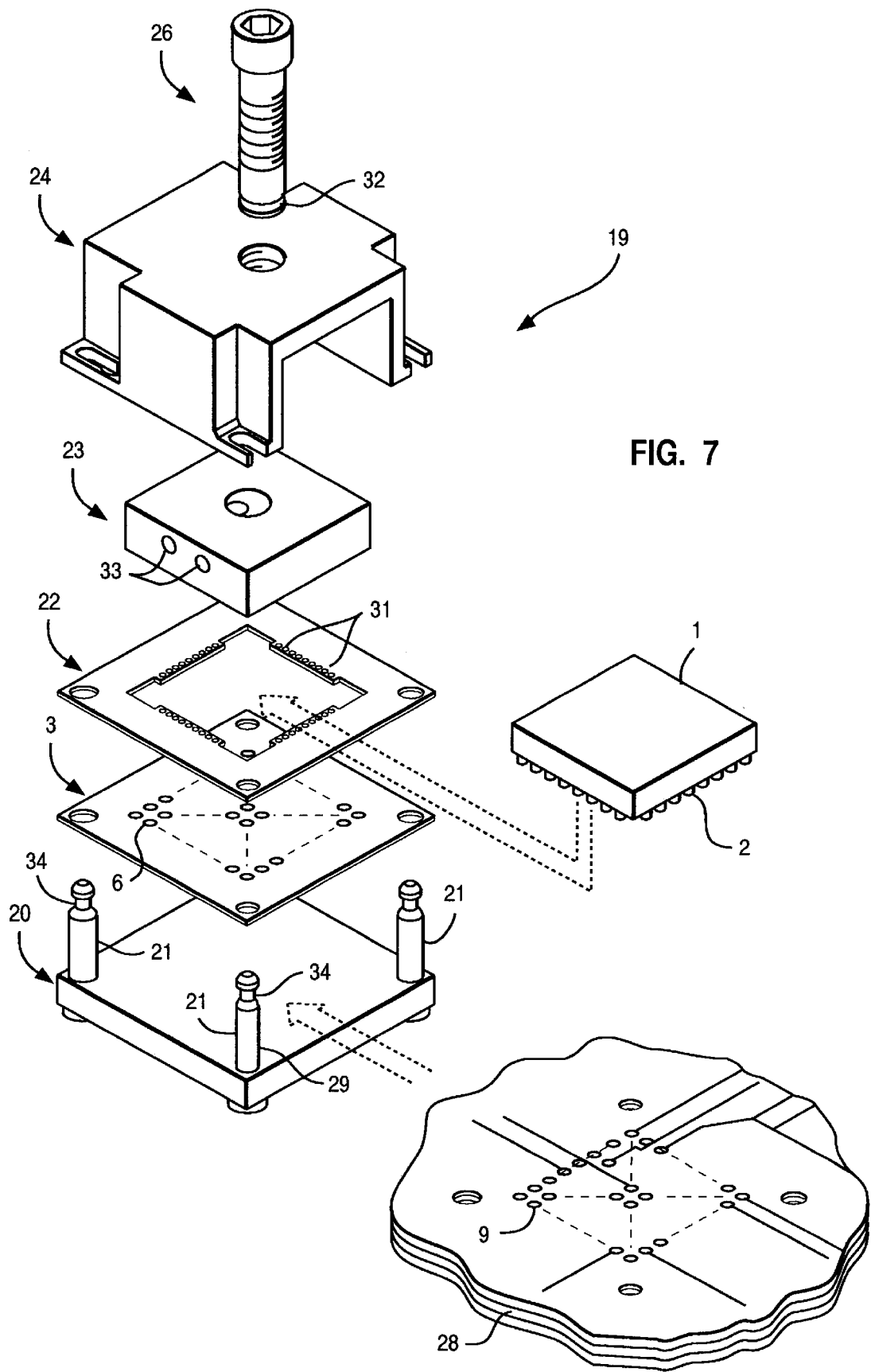
FIG. 7 depicts in an exploded view a preferred embodiment of the socket at its relation to the printed circuit board and the flip chip die or ball grid array module.

FIG. 7 depicts by exploded view a composite embodiment of the whole socket and the relative locations of the flip chip die or ball grid array module electronic device as well as the printed circuit board to which the electronic device is attached. Socket 19 includes a rigid and planar stiffener 20 with alignment pins 21, interposer 3, locator 22, rigid cap 23, arch 24, and screw 26. As depicted in FIG. 7, flip chip die or ball grid array module 1 is situated between locator 22 and cap 23. Printed circuit board 28 is situated between stiffener 20 and interposer 3. Stiffener 20 and cap 23 ensure that the electrically connecting elements, namely the pattern of solder deposits 9 on printed circuit board 28, the dendrite plated vias or pads 6 on interposer 3, and the solder balls 2 of flip chip die or ball grid array module 1 remain coplanar during compressive connection. Locator 22 is sufficiently thin that connection between flip chip die or ball grid array module 1 and interposer 3 is not affected.

Stiffener 20 in FIG. 7 utilizes a single thinner alignment pin 29 to orient the socket elements with printed circuit board 28. Alignment pins 21 of stiffener 20 ensure that printed circuit board 28, interposer 3 and locator 22 are aligned within the tight tolerances characterizing flip chip die or ball grid array module solder ball patterns. Flip chip die or ball grid array device 1 is itself aligned to socket 19 through the use of holes 31 in locator 22. Holes 31 mate directly with solder balls 2 on flip chip die or ball grid array module 1. As noted earlier, locator 22 is sufficiently thin to allow solder balls 2 to make contact with interposer 3 after passing through holes 31. The use of mating locator 22 to align flip chip die or ball grid array module 1 improves the alignment, in that the accurately positioned solder balls are aligned directly rather than using the edges or corners of the flip chip die or module as the alignment references. The latter references are far less accurate.

Compressive force is applied through cap 23 directly onto flip chip die or ball grid array module 1 during the mounting process. Preferably, cap 23 is composed of a high specific heat thermally conductive material. Since cap 23 is in direct contact with the flip chip die or ball grid array module 1 it then serves as a heat sink. Where appropriate cap 23 may be extended to include cooling fins.

The force as applied by screw 26 to cap 23 is directed at the center of cap 23 by engaging grove 32 with pins inserted through holes 33 in cap 23. Thereby, cap 23 pivots freely around the end of screw 26 to align the underlying elements coplanar for an even distribution the compressive force when the underlying elements are not perfectly planar.

As embodied in socket 19, arch 24 is attached to backup plate 21 by sliding engagement with groves 34 in the ends of alignment pins 21 of stiffener 20.

Figure 8:
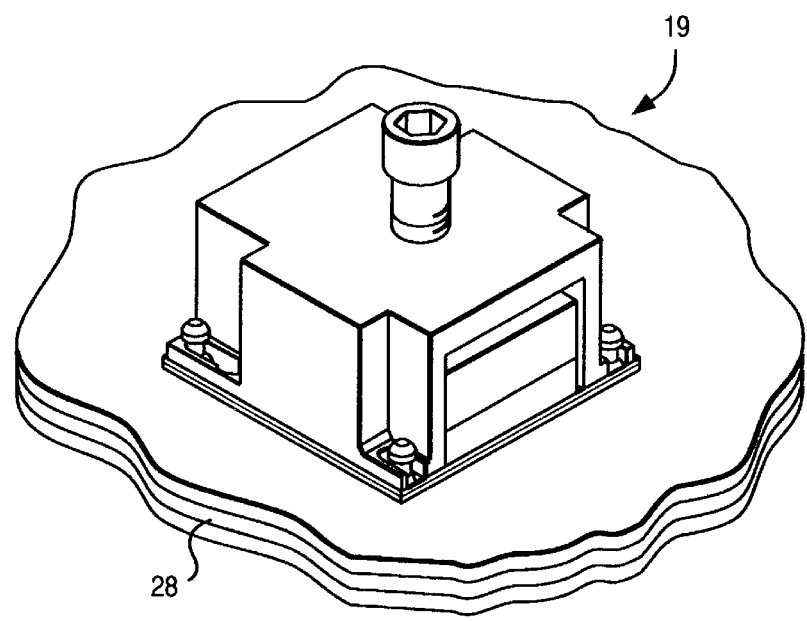
FIG. 8 is a schematic depiction of a socket when fully connected.

FIG. 8 depicts socket 19 as it would appear when connected to printed circuit board 28. Note that the alignment pins are engaged into the slots of the arch and that the screw has been torqued as necessary to connect the flip chip die or ball grid array module to the printed circuit board.

Socket 19 as embodied in FIG. 7 allows temporary or permanent connection of flip chip die or ball grid array devices to printed circuit boards through replaceable dendritic interposers, and includes resources for applying force over the ball grid array area, resources for aligning the flip chip die or ball solder grid array balls directly to the socket, and resources for heat sinking the flip chip die or ball grid array module. Furthermore, reconfiguration of the interconnect pattern between the flip chip die or module and the underlying printed circuit board lands can be accomplished through the use of interposers having selectively connected pads or multilayer interposers with reconfiguration wiring. The fundamental structure of socket 19 is suitable for burn-in or testing of flip chip die or ball grid array modules as well as for mounting such devices on motherboards of computer systems. The flip chip die or ball grid array module is readily interchanged using either the original interposer or a low cost replacement interposer. Furthermore, since the interposer can be of multiple layers with wiring reconfiguration capability, flip chip die or ball grid array modules can be replaced with devices having different ball grid array physical or input/output patterns. Lastly, one side of a multi-layer interposer can be extended in the sense of a flat cable to monitor the flip chip die or ball grid array module signals as they appear directly at the solder balls of such devices.

Although the invention has been described and illustrated by way of a specific embodiment, the apparatus encompassed by the invention should be interpreted to be in keeping with the breadth of the claims set forth hereinafter.

We claim:

1. A solder ball array device socket, comprising:

a rigid stiffener with a planar surface;

a rigid cap with a planar surface alignable to be substantially coplanar with the planar surface of the stiffener;

alignment pins extending from connections on the stiffener to connections on a compression arch;

a planar interposer of flexible dielectric material having a multiplicity of vias or pads covered with dendrites, which vias or pads are distributed in a pattern substantially conforming to an electrical ball grid array device, and having holes for the alignment pins;

means for positioning the ball grid array device having alignment holes for mating to the balls of the ball grid array device, and having holes for the alignment pins; and compression adjusting means in the compression arch to compress the planar interposer, the ball grid array device, and a board with an array of corresponding contacts between the cap and the stiffener adequately to cause dendrite penetration into ball grid array device balls and board contacts.

2. The apparatus recited in claim 1, wherein the planar interposer is comprised of multiple layers with patterned electrical paths connecting selected vias or pads.

3. The apparatus recited in claim 2, wherein the compression adjusting means is selectively adjustable as to compression force and applies the compression force central to the cap.

4. The apparatus recited in claim 3, wherein the cap is a thermally conductive heat sink.

* * * * *